(12) United States Patent
Li et al.

(10) Patent No.: US 11,742,824 B2
(45) Date of Patent: Aug. 29, 2023

(54) BULK ACOUSTIC RESONATOR WITH HEAT DISSIPATION STRUCTURE AND FABRICATION PROCESS

(71) Applicant: JWL (ZHEJIANG) SEMICONDUCTOR CO., LTD., Zhejiang (CN)

(72) Inventors: Linping Li, Zhejiang (CN); Jinghao Sheng, Zhejiang (CN); Zhou Jiang, Zhejiang (CN)

(73) Assignee: JWL (ZHEJIANG) SEMICONDUCTOR CO., LTD.

( * ) Notice: Subject to any disclaimer, the term of this patent is extended or adjusted under 35 U.S.C. 154(b) by 0 days.

(21) Appl. No.: 17/798,345

(22) PCT Filed: Aug. 12, 2020

(86) PCT No.: PCT/CN2020/108710
§ 371 (c)(1),
(2) Date: Aug. 9, 2022

(87) PCT Pub. No.: WO2021/169187
PCT Pub. Date: Sep. 2, 2021

(65) Prior Publication Data
US 2023/0076029 A1    Mar. 9, 2023

(30) Foreign Application Priority Data
Feb. 27, 2020    (CN) .......................... 202010125577.0

(51) Int. Cl.
*H03H 9/02*    (2006.01)
*H03H 3/02*    (2006.01)
(Continued)

(52) U.S. Cl.
CPC .......... *H03H 9/02102* (2013.01); *H03H 3/02* (2013.01); *H03H 9/131* (2013.01);
(Continued)

(58) Field of Classification Search
CPC .... H03H 9/02102; H03H 9/133; H03H 9/173; H03H 9/54
See application file for complete search history.

(56) References Cited

U.S. PATENT DOCUMENTS

| 2006/0017352 | A1 | 1/2006 | Tanielian | |
| 2007/0120625 | A1* | 5/2007 | Larson | H03H 9/584 333/189 |

(Continued)

FOREIGN PATENT DOCUMENTS

| CN | 103444080 A | 12/2013 |
| CN | 107528561 A | 12/2017 |

(Continued)

OTHER PUBLICATIONS

Japanese Office Action 2022-549270, dated Mar. 7, 2023.
(Continued)

*Primary Examiner* — Bryan P Gordon
(74) *Attorney, Agent, or Firm* — The Belles Group, P.C.

(57) ABSTRACT

A bulk acoustic resonator having a heat dissipation structure, and a fabrication process are provided according to the present application. The bulk acoustic resonator includes a substrate, a metal heat dissipation layer formed on the base substrate and provided with an insulating layer on the surface thereof, and a resonance functional layer formed on the insulating layer, where the metal heat dissipation layer and the insulating layer together define a cavity on the substrate, a side wall of the cavity is formed by the insulating layer, and a bottom electrode layer in the resonance function layer covers the cavity.

10 Claims, 7 Drawing Sheets

(51) Int. Cl.
*H03H 9/13* (2006.01)
*H03H 9/17* (2006.01)
*H03H 9/54* (2006.01)

(52) U.S. Cl.
CPC ............ *H03H 9/133* (2013.01); *H03H 9/173* (2013.01); *H03H 9/54* (2013.01); *H03H 2003/021* (2013.01)

(56) References Cited

U.S. PATENT DOCUMENTS

| | | | | |
|---|---|---|---|---|
| 2007/0194863 | A1* | 8/2007 | Shibata | H03H 3/02 333/187 |
| 2008/0024041 | A1* | 1/2008 | Shibata | H03H 9/105 29/25.35 |
| 2014/0018126 | A1 | 1/2014 | Asai | |
| 2016/0373083 | A1* | 12/2016 | Lee | H03H 9/173 |
| 2018/0191322 | A1* | 7/2018 | Chang | H03H 9/132 |
| 2018/0234075 | A1 | 8/2018 | Lee et al. | |
| 2019/0103851 | A1 | 4/2019 | Yusuf | |
| 2019/0356293 | A1* | 11/2019 | Kim | H03H 9/132 |

FOREIGN PATENT DOCUMENTS

| | | |
|---|---|---|
| CN | 107528561 A | 12/2017 |
| CN | 108429543 A | 8/2018 |
| CN | 207939485 U | 10/2018 |
| CN | 109474252 A | 3/2019 |
| CN | 209709146 U | 11/2019 |
| CN | 209710062 U | 11/2019 |
| CN | 111193490 A | 5/2020 |
| CN | 111262542 A | 6/2020 |
| JP | 2006050021 A | 2/2006 |
| JP | 2007208727 A | 8/2007 |
| JP | 2007221588 A | 8/2007 |
| JP | 2007281846 A | 10/2007 |
| JP | 2010154233 A | 7/2010 |
| JP | 2019201400 A | 11/2019 |
| KR | 20140010102 A | 1/2014 |
| KR | 20190038435 A | 4/2019 |

OTHER PUBLICATIONS

Korean Office Action 10-2022-7031650, dated Dec. 23, 2022.
Chinese Office Action 202010125577.0, dated Jul. 8, 2021.
Korean Office Action 10-2022-7031650, dated Apr. 27, 2023.

* cited by examiner

BULK ACOUSTIC RESONATOR WITH HEAT DISSIPATION STRUCTURE AND FABRICATION PROCESS

CROSS-REFERENCE TO RELATED PATENT APPLICATIONS

The present application is the national phase of International Patent Application No. PCT/CN2020/108710, titled "BULK ACOUSTIC RESONATOR WITH HEAT DISSIPATION STRUCTURE AND FABRICATION PROCESS", filed on Aug. 12, 2020, which claims the priority to Chinese Patent Application No. 202010125577.0, titled "BULK ACOUSTIC RESONATOR WITH HEAT DISSIPATION STRUCTURE AND FABRICATION PROCESS", filed with the China National Intellectual Property Administration on Feb. 27, 2020. The disclosures of the aforementioned priority applications are incorporated herein by reference in their entireties.

The present application relates to the technical field of communication devices, and in particular to a bulk acoustic resonator with a heat dissipation structure and a fabrication process.

BACKGROUND

As the electromagnetic spectrum becomes increasingly crowded and the frequency bands and functions of wireless communication devices increase, the electromagnetic spectrum used in wireless communication has increased rapidly from 500 MHz to more than 5 GHz. Therefore, there is an increasing demand for radio frequency front-end modules with high performance, low cost, low power consumption and small size. The filter is one of the radio frequency front-end modules, which is mainly composed of multiple resonators connected through a topology network structure. The filter can improve the transmitted signal and the received signal. Fbar (Thin film bulk acoustic resonator) is a type of bulk acoustic resonator. The filter composed of Fbar has the advantages of small size, high integration adaptability, high quality factor Q when working at high frequency, and strong power bearing capacity, and is therefore a core component of the radio frequency front-end.

The basic structure of Fbar consists of upper and lower electrodes and a piezoelectric layer sandwiched between the upper and lower electrodes. The piezoelectric layer can realize the conversion between electrical energy and mechanical energy. When an electric field is applied to the upper and lower electrodes of the Fbar, the piezoelectric layer generates mechanical energy in the form of sound waves. Due to the basic structure, substrate and selected materials of Fbar, Fbar does not have good heat dissipation. In addition, the increasingly crowded electromagnetic waves and the mutual electromagnetic interference between the internal components of radio frequency terminal products may affect the use effect of the components.

In the conventional technology, a cavity of a bulk acoustic resonator is generally etched on a substrate or a support layer. The material of the substrate or support layer generally uses Si or Si3N4, so it has no heat dissipation effect and low reliability. Therefore, the present application aims to design a bulk acoustic resonator with good heat dissipation and capable of shielding electromagnetic interference.

SUMMARY

In view of the above-mentioned problems that bulk acoustic resonator has no heat dissipation effect and no electromagnetic shielding effect, a bulk acoustic resonator with a heat dissipation structure and a fabrication process are proposed according to the present application to solve the above problems.

In a first aspect, a bulk acoustic resonator with a heat dissipation structure is proposed according to the present application, including a substrate, a metal heat dissipation layer formed on the substrate and provided with an insulating layer on its surface, and a resonance function layer formed on the insulating layer. The metal heat dissipation layer and the insulating layer define a cavity on the substrate, and a bottom electrode layer in the resonance function layer covers the cavity. The metal heat dissipation layer confers a heat dissipation effect on the bulk acoustic resonator.

In some embodiments, an edge of the bottom electrode layer is laid on the insulating layer formed on a side of the cavity. Therefore, the bottom electrode layer is not arranged on the metal heat dissipation layer, which does not affect the performance of the bulk acoustic resonator since no capacitor is formed, and reduces parasitic effects.

In some embodiments, the resonance function layer further includes a piezoelectric layer and a top electrode layer which are sequentially stacked on the bottom electrode layer. The bottom electrode layer, the piezoelectric layer and the top electrode layer form an effective resonance area above the cavity. The resonance function layer converts electrical energy into mechanical energy, and produces a resonance effect in the form of sound waves.

In some embodiments, the top electrode layer includes a connecting part extending from the effective resonance area of the resonance function layer to another peripheral resonator, and the metal heat dissipation layer is not completely distributed below the connecting part. As little metal heat dissipation layer as possible should be distributed below the top electrode layer, so that it is not easy to form a capacitor and the performance of the bulk acoustic resonator is not affected.

In some embodiments, a sacrificial material layer is arranged in a gap below the connecting part and the piezoelectric layer. An upper surface of the sacrificial material layer is flush with an upper surface of the insulating layer. The piezoelectric layer is disposed on the upper surface of the sacrificial material layer, the insulating layer and the bottom electrode layer. Therefore, the piezoelectric layer can have a relatively flat surface, which reduces the stress influence and improves the resonance performance of the bulk acoustic resonator. The sacrificial material layer plays the role of dielectric filling.

In some embodiments, part of the piezoelectric layer, beyond the effective resonance area and the connecting part, is provided with a metal pillar, where the metal pillar extends through the piezoelectric layer and the insulating layer, and extends to the metal heat dissipation layer. The metal pillar is used to lead the heat out to the outside, thus improving the heat dissipation effect. The arrangement of the metal pillar on the area beyond the effective resonance area does not affect the performance of the bulk acoustic resonator.

In some embodiments, the bulk acoustic resonator further includes an adhesive layer disposed on the substrate. The adhesive layer can increase the adhesion of a metal shielding layer, and can also play a role of electromagnetic shielding.

In some embodiments, a metal shielding layer is provided on the adhesive layer. The metal shielding layer is in conduction with the metal heat dissipation layer and the metal pillar, thus forming an electromagnetic shielding structure to shield external interference and shield interference from internal to external.

In some embodiments, the metal heat dissipation layer is made of a composite multilayer metal layer material composed of one or more of Ag, Cu, Au, Al, Mo, W, Zn, Ni, Fe and Sn. The material selected for the metal heat dissipation layer has a high thermal conductivity, and can play the role of supporting the film layers above.

In some embodiments, the material of the insulating layer includes one or more of AlN, Si and SiN. The material of the insulating layer also has a high thermal conductivity, and can isolate the bottom electrode layer from the metal heat dissipation layer, and can protect the metal heat dissipation layer, thus improving the service life and reliability of the bulk acoustic resonator.

In some embodiments, the material of the metal pillar includes Ag, Cu, Au, Al, Mo, W, Zn, Ni, Fe, or Sn. The material of the metal pillar also needs to have good thermal conductivity.

In a second aspect, a fabrication process of a bulk acoustic resonator with a heat dissipation structure is further provided according to the present application, including the following steps:

S1, forming a metal heat dissipation layer on a substrate, and etching the metal heat dissipation layer to form a first cavity;

S2, forming an insulating layer on the substrate and the metal heat dissipation layer, where a second cavity is formed, by the insulating layer, on the basis of the first cavity;

S3, filling the second cavity with a sacrificial material; and

S4, forming a resonance function layer on the sacrificial material and the insulating layer in sequence, where the second cavity is covered by a bottom electrode layer of the resonance function layer.

The metal heat dissipation layer can dissipate the heat of the bulk acoustic resonator, conferring a good heat dissipation effect on the bulk acoustic resonator.

In some embodiments, S1 specifically includes: forming a metal heat dissipation layer having a first cavity on a substrate by sputtering, photolithography and etching, or evaporation and spalling, or electroplating. The above preparation process is simple and the technique thereof is fully developed.

In some embodiments, the resonance function layer includes a bottom electrode layer, a piezoelectric layer and a top electrode layer which are sequentially stacked, where the top electrode layer includes a connecting part extending from an effective resonance area to another peripheral resonator, and the metal heat dissipation layer is not completely distributed below the connecting part. As little metal heat dissipation layer as possible should be distributed below the top electrode layer, so that it is not easy to form a capacitor and the performance of the bulk acoustic resonator is not affected.

In some embodiments, S3 further includes: steps of filling a gap between the connecting part and the insulating layer with a sacrificial material, and performing chemical mechanical polishing to keep the upper surfaces of the sacrificial material and the insulating layer flat. Therefore, the piezoelectric layer can have a relatively flat surface, which reduces the stress influence and improves the resonance performance of the bulk acoustic resonator. The sacrificial material herein plays the role of dielectric filling.

In some embodiments, an edge of the bottom electrode layer is laid on the insulating layer formed on a side of the first cavity. Therefore, the bottom electrode layer is not arranged on the metal heat dissipation layer, which does not affect the performance of the bulk acoustic resonator since no capacitor is formed, and reduces parasitic effects.

In some embodiments, the fabrication process further includes:

S5: forming a hole directed through the piezoelectric layer and the insulating layer and reaching the metal heat dissipation layer on part of the piezoelectric layer beyond the effective resonance area and the connecting part of the resonance function layer; and S6: forming a metal pillar in the hole.

The metal pillar is formed on the area beyond the effective resonance area and the connecting part, which does not affect the performance of the bulk acoustic resonator and can dissipate the heat in the metal heat dissipation layer.

In some embodiments, the following step is further included after step S6: removing the sacrificial material in the second cavity. After the sacrificial material in the second cavity is removed, the second cavity is released to form a part with a resonance function.

In some embodiments, the following step is further included before S1: forming an adhesive layer on the substrate. The adhesive layer can increase the adhesion of a metal shielding layer, and can also play a role of electromagnetic shielding.

In some embodiments, the following step is further included before S1: forming a metal shielding layer on the adhesive layer. The metal shielding layer is in conduction with the metal heat dissipation layer and the metal pillar, thus forming an electromagnetic shielding structure to shield external interference and shield interference from internal to external.

In some embodiments, the metal heat dissipation layer is made of a composite multilayer metal layer material composed of one or more of Ag, Cu, Au, Al, Mo, W, Zn, Ni, Fe and Sn. The material selected for the metal heat dissipation layer has a high thermal conductivity, and can play the role of supporting the film layers above.

In some embodiments, the material of the insulating layer includes one or more of AlN, Si and SiN. The material of the insulating layer also has a high thermal conductivity, and can isolate the bottom electrode layer from the metal heat dissipation layer, and can protect the metal heat dissipation layer, thus improving the service life and reliability of the bulk acoustic resonator.

In some embodiments, the material of the metal pillar includes Ag, Cu, Au, Al, Mo, W, Zn, Ni, Fe, or Sn. The material of the metal pillar also needs to have good thermal conductivity.

A bulk acoustic resonator with a heat dissipation structure and a fabrication process are proposed according to the present application, where the bulk acoustic resonator includes a substrate, a metal heat dissipation layer formed on the substrate and provided with an insulating layer on its surface, and a resonance function layer formed on the insulating layer. The metal heat dissipation layer and the insulating layer define a cavity on the substrate, and a bottom electrode layer in the resonance function layer covers the cavity. The metal heat dissipation layer is arranged around the cavity, so the bulk acoustic resonator can dissipate heat in time during use, thereby improving the service life of the bulk acoustic resonator. In the structural design of the bulk acoustic resonator of the present application, the metal heat dissipation layer, the bottom electrode layer and the top electrode layer are such arranged as not to form capacitors as much as possible, so as to reduce the parasitic capacitance of the resonator and effectively improve the performance of the resonator. In addition, the resonator may further include an electromagnetic shielding structure, so that under the premise of reducing the parasitic capacitance of the resonator, the resonator has good heat dissipation and anti-electromagnetic shielding effect during use, and has good reliability while working normally and stably.

BRIEF DESCRIPTION OF THE DRAWINGS

The accompanying drawings are included to provide a further understanding of the embodiments and are incorporated into and constitute a part of this specification. The drawings illustrate embodiments, and together with the description serve to explain the principles of the present application. In this way, many other embodiments and expected advantages of the embodiments can be easily anticipated, because they may be better understood by referring to the following detailed description. The elements of the drawings are not necessarily drawn to scale with reference to each other. Same reference numerals refer to corresponding similar parts.

DETAILED DESCRIPTION OF THE EMBODIMENTS

Figure 1:
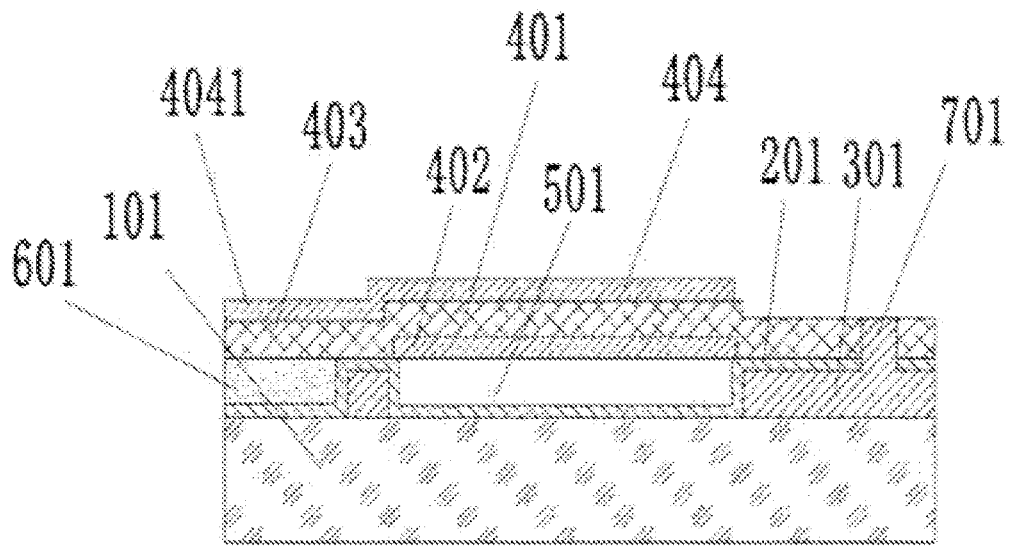
FIG. 1 shows a cross-sectional view of a bulk acoustic resonator with a heat dissipation structure according to an embodiment of the present application.

The present application is described in detail below in conjunction with the drawings and embodiments. It should be understood that the specific embodiments described herein are only used to explain the present application, but not to limit the present application. It also should be noted that, for ease of description, the drawings merely show the related parts to the present application. It should be noted that the dimensions and sizes of components in the drawings are not drawn to scale and the size of some components may be highlighted for clarity.

It should be noted that embodiments of the present application and features in the embodiments may be combined with each other as long as there is no conflict. The present application will be illustrated in detail hereinafter in conjunction with the drawings and the embodiments.

A bulk acoustic resonator with a heat dissipation structure is provided according to the present application. As shown in FIG. 1, the bulk acoustic resonator includes a substrate 101, a metal heat dissipation layer 301 formed on the substrate 101 and provided with an insulating layer 201 on its surface, and a resonance function layer 401 formed on the insulating layer 201. The insulating layer 201 covers the surface of the metal heat dissipation layer 301, which can isolate the resonance function layer 401 from the metal heat dissipation layer 301, and can also protect the metal heat dissipation layer 301 from erosion, thus improving the service life and reliability of the bulk acoustic resonator. In a specific embodiment, the insulating layer 201 may cover the surfaces of the substrate 101 and the metal heat dissipation layer 301, or may only cover the surface of the metal heat dissipation layer 301. The metal heat dissipation layer 301 and the insulating layer 201 define a cavity 501 on the substrate 101. The metal heat dissipation layer 301 surrounds the cavity 501, so the heat of the bulk acoustic resonator can be easily conducted out. In a preferred embodiment, the metal heat dissipation layer 301 is made of a composite multilayer metal layer material composed of one or more of Ag, Cu, Au, Al, Mo, W, Zn, Ni, Fe and Sn. The material selected for the metal heat dissipation layer 301 has a high thermal conductivity and hardness, and can support the film layers above. The material of the insulating layer 201 includes one or more of AlN, Si and SiN, where AlN is preferably used as the material of the insulating layer 201, and the thermal conductivity of AlN is relatively high. The material of the substrate 101 includes Si/Glass/Sapphire/Spinel and the like.

In a specific embodiment, an edge of a bottom electrode layer 402 is laid on the insulating layer 201 formed on a side of the cavity 501. The metal heat dissipation layer 301 and the insulating layer 201 define the cavity 501 on the substrate 101. Moreover, the metal heat dissipation layer 301 is covered by the insulating layer 201, so the cavity 501 is also formed on the insulating layer 201. The bottom electrode layer 402 is laid on the insulating layer 201 and covers the cavity 501. The edge of the bottom electrode layer 402 is laid on the insulating layer 201 formed on the side of the cavity 501, and a projection of the bottom electrode layer 402 on the substrate 101 does not exceed the insulating layer 201 on the side of the cavity 501. Therefore, no capacitor is formed between the bottom electrode layer 402 and the metal heat dissipation layer 301, which can effectively reduce parasitic effects without affecting the performance of the bulk acoustic resonator.

Figure 2:
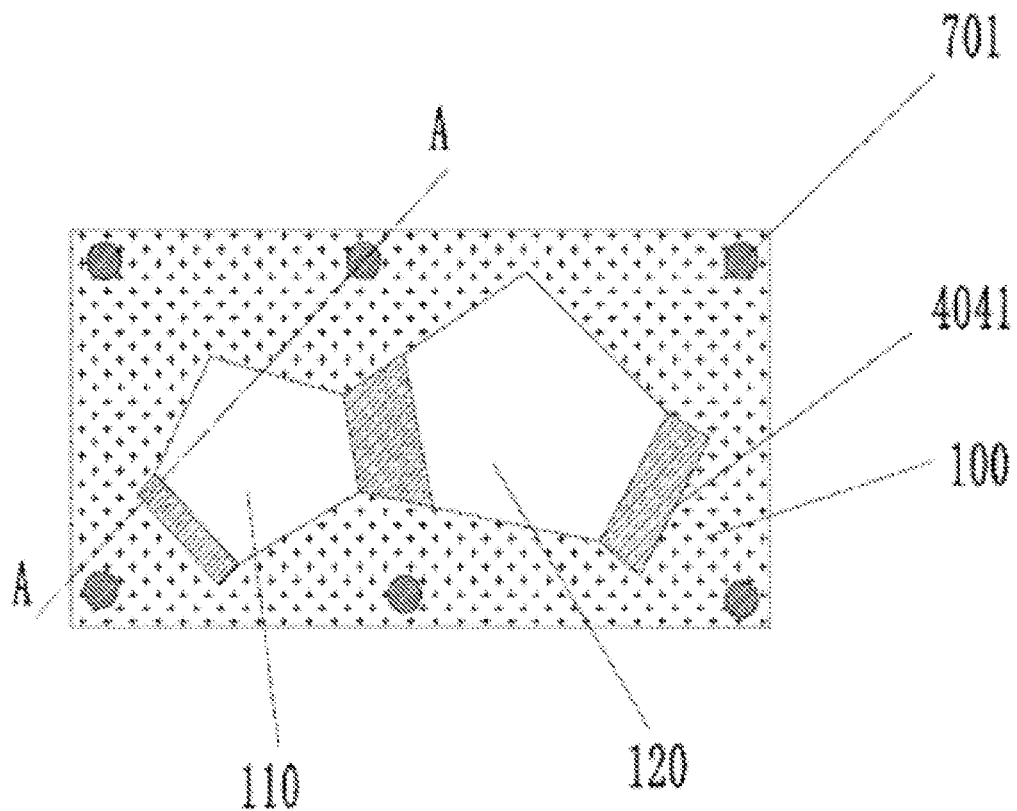
FIG. 2 shows a top view of the bulk acoustic resonator with a heat dissipation structure according to an embodiment of the present application.

In a specific embodiment, the resonance function layer 401 further includes a piezoelectric layer 403 and a top electrode layer 404 which are sequentially stacked on the bottom electrode layer 402. The resonance function layer 401 converts electrical energy into mechanical energy, and the mechanical energy propagates in the form of sound waves and generates a resonance effect. The bottom electrode layer 402, the piezoelectric layer 403 and the top electrode layer 404 all cover the cavity 501 and form an effective resonance area above the cavity 501. In a specific embodiment, the top electrode layer 404 includes a connecting part 4041 extending from the effective resonance area of the resonance function layer 401 to another peripheral resonator, and the metal heat dissipation layer 301 is not completely distributed below the connecting part 4041. FIG. 1 is a cross-sectional view taken along line A-A in FIG. 2. As shown in FIGS. 2, 110 and 120 are two connected resonators, where 4041 is the interconnection or wiring area between the resonators, and 100 is the area outside the resonators. A part of the metal heat dissipation layer 301 which plays a supporting role presents below the part where the connecting part 4041 of the top electrode layer 404 is connected to the effective resonance area. The part of the metal heat dissipation layer 301 supports the bottom electrode layer 402 and forms the cavity 501 together with the insulating layer 201. As little metal heat dissipation layer 301 as possible should be distributed below the top electrode layer 404, so that it is not easy to form a capacitor and the performance of the bulk acoustic resonator is not affected. If the metal heat dissipation layer 301 is missing below the connecting part 4041 of the top electrode layer 404, a stress change occurs in the piezoelectric layer 403 below the connecting part 4041 of the top electrode layer 404, which easily affects the resonance performance of the bulk acoustic resonator. In a preferred embodiment, a sacrificial material layer 601 is arranged in a gap below the connecting part 4041 and the piezoelectric layer 403. In one case, the sacrificial material layer 601 may be formed on the insulating layer 201 such that the upper surface of the sacrificial material layer 601 is flush with the upper surface of the insulating layer 201. Therefore, a relatively flat piezoelectric layer 403 may be obtained by arranging the piezoelectric layer 403 on the sacrificial material layer 601, the insulating layer 201 and the bottom electrode layer 402. In another case, the sacrificial material layer 601 may also be formed below the insulating layer 201. And in this case, the piezoelectric layer 403 is formed on the insulating layer 201 and the bottom electrode layer 402 which have flat surfaces. Therefore, it can be ensured that the piezoelectric layer 403 has a relatively flat surface, the influence of the stress change of the film layer on the resonance performance of the bulk acoustic resonator can be reduced, and the resonance performance of the resonator can be effectively improved. In these two cases, the sacrificial material layer 601 plays the role of dielectric filling to ensure that the piezoelectric layer 403 has a relatively flat surface.

In a specific embodiment, part of the piezoelectric layer 403, beyond the effective resonance area and the connecting part 4041, is provided with a metal pillar 701, where the metal pillar 701 extends through the piezoelectric layer 403 and the insulating layer 201, and extends to the metal heat dissipation layer 301. The metal pillar 701 is formed on the area beyond the effective resonance area and the connecting part 4041, which does not affect the performance of the bulk acoustic resonator. The metal pillar 701 is mainly used for connecting with the metal heat dissipation layer 301 to lead the heat collected by the metal heat dissipation layer 301 out to the outside, thus improving the heat dissipation effect. In a preferred embodiment, the material of the metal pillar 701 includes Ag, Cu, Au, Al, Mo, W, Zn, Ni, Fe, or Sn. The material of the metal pillar 701 also needs to have good thermal conductivity so as to conduct the heat out.

Figure 3:
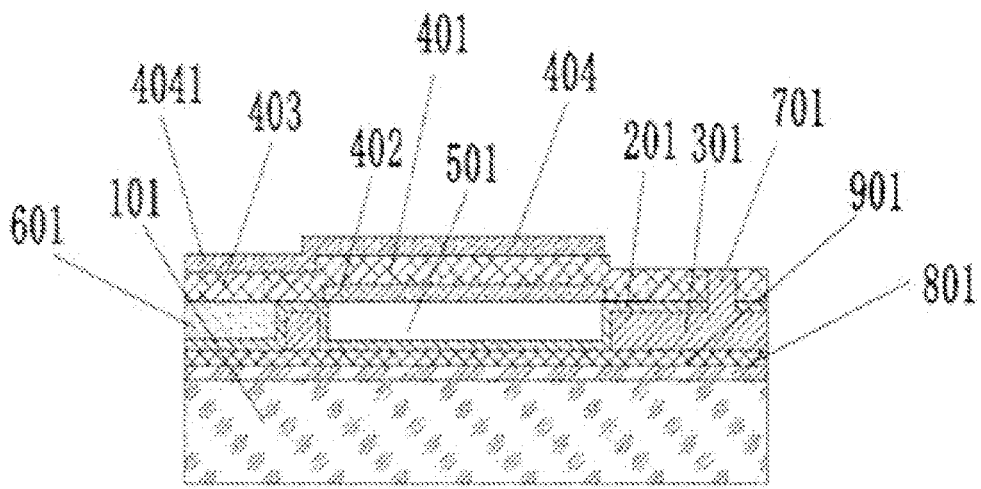
FIG. 3 shows a cross-sectional view of the bulk acoustic resonator with a heat dissipation structure according to another embodiment of the present application.

In a specific embodiment, as shown in FIG. 3, the bulk acoustic resonator further includes an adhesive layer 801 disposed on the substrate 101. A metal shielding layer 901 is provided on the adhesive layer 801. Therefore, the metal heat dissipation layer 301 is formed on the metal shielding layer 901, and the metal shielding layer 901 is in conduction with the metal heat dissipation layer 301 and the metal pillar 701. If the metal pillar 701 is grounded, an electromagnetic shielding structure can be formed between the metal shielding layer 901, the metal heat dissipation layer 301 and the metal pillar 701, shielding external electromagnetic interference sources and shielding electromagnetic interference from internal to external, so that the bulk acoustic resonator has an electromagnetic shielding effect. The adhesive layer 801 provided on the substrate 101 can increase the adhesion of the metal shielding layer 901, and can also play a role of electromagnetic shielding. Preferably, the material of the adhesive layer 801 can be selected from Ti or TiW, and the material of the metal shielding layer 901 can be selected from metals such as Cu.

Figure 4:
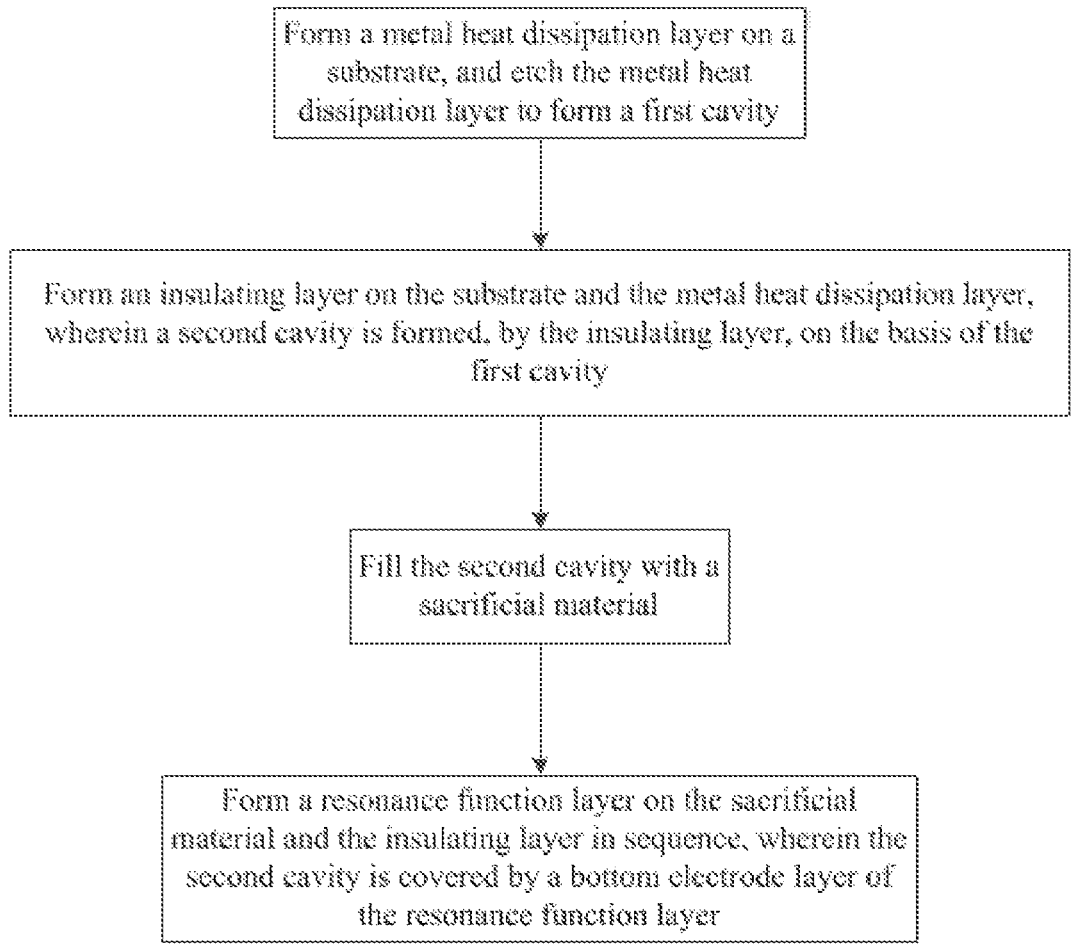
FIG. 4 shows a flowchart of a fabrication process of a bulk acoustic resonator with a heat dissipation structure according to an embodiment of the present application.

A fabrication process of a bulk acoustic resonator with a heat dissipation structure is further provided according to the present application, as shown in FIG. 4, including the following steps:

S1, forming a metal heat dissipation layer on a substrate, and etching the metal heat dissipation layer to form a first cavity;

S2, forming an insulating layer on the substrate and the metal heat dissipation layer, where a second cavity is formed, by the insulating layer, on the basis of the first cavity;

S3, filling the second cavity with a sacrificial material; and

S4, forming a resonance function layer on the sacrificial material and the insulating layer in sequence, where the second cavity is covered by a bottom electrode layer of the resonance function layer.

Figure 5A:
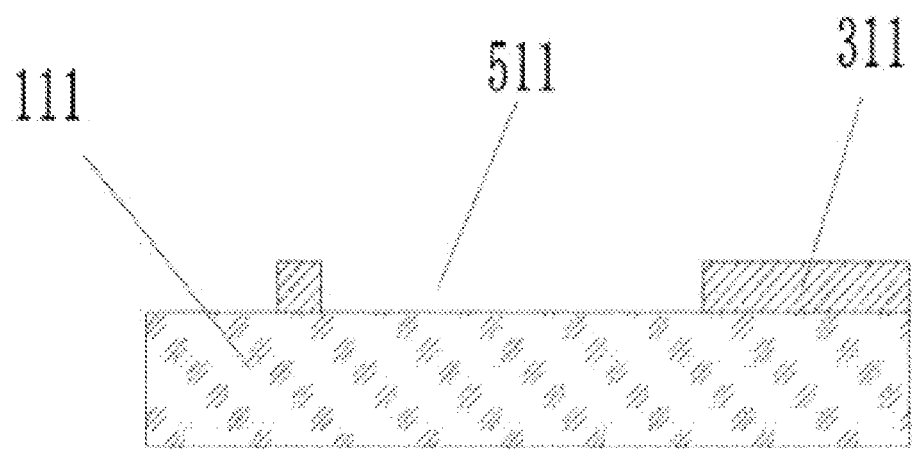
FIGS. 5a-5j show schematic structural diagrams of respective steps of the fabrication process of a bulk acoustic resonator with a heat dissipation structure according to an embodiment of the present application.

In a specific embodiment, FIGS. 5a-5j show schematic structural diagrams of respective steps of the fabrication process of a bulk acoustic resonator with a heat dissipation structure. As shown in FIG. 5a, S1 specifically includes: forming a metal heat dissipation layer 311 having a first cavity 511 on a substrate 111 by sputtering, photolithography and etching, or evaporation and spalling, or electroplating. The metal heat dissipation layer 311 defines the first cavity 511 on the substrate 111. The metal heat dissipation layer 311 surrounds the first cavity 511, so the heat of the bulk acoustic resonator can be easily conducted out. In a preferred embodiment, the material of the substrate 111 includes Si/Glass/Sapphire/Spinel and the like. The metal heat dissipation layer 311 is made of a composite multilayer metal layer material composed of one or more of Ag, Cu, Au, Al, Mo, W, Zn, Ni, Fe and Sn. The material selected for the metal heat dissipation layer 311 has a high thermal conductivity and hardness, and can support the film layers above.

Figure 5B:
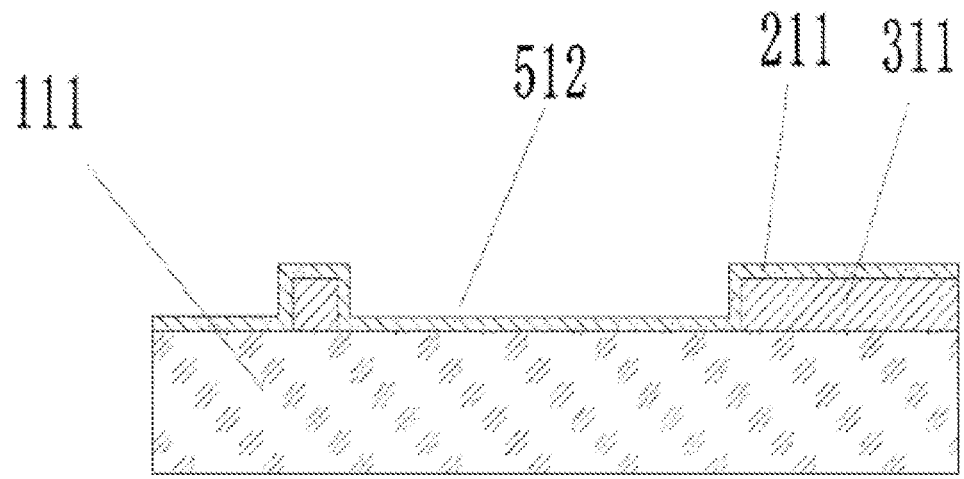

On the basis of the above, as shown in FIG. 5b, the insulating layer 211 is deposited on the substrate 111 and the metal heat dissipation layer 311 by PECVD or sputtering. The insulating layer 211 covers the surface of the metal heat dissipation layer 311, which can isolate a resonance function layer 411 from the metal heat dissipation layer 311, and can also protect the metal heat dissipation layer 311 from erosion, thus improving the service life and reliability of the bulk acoustic resonator. The material of the insulating layer 211 includes one or more of AlN, Si and SiN, where AlN is preferably used as the material of the insulating layer 211, and the thermal conductivity of AlN is relatively high.

Figure 5C:
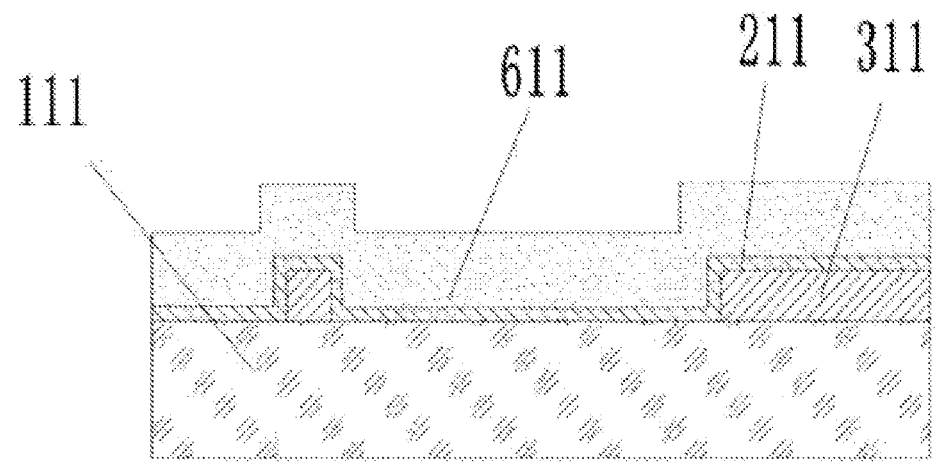
Figure 5D:
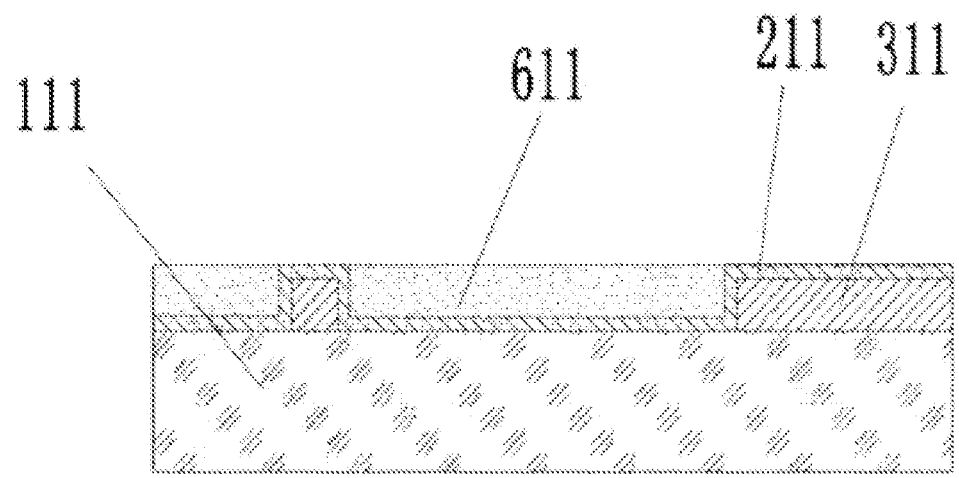

In a specific embodiment, the resonance function layer 411 includes a bottom electrode layer 412, a piezoelectric layer 413 and a top electrode layer 414 which are sequentially stacked, where the top electrode layer 414 includes a connecting part 4141 extending from an effective resonance area to another peripheral resonator. As shown in FIG. 5c, a sacrificial material 611 is deposited on the insulating layer 211 by PECVD. S3 further includes: filling a gap below the connecting part 4141 and the piezoelectric layer 413 with a sacrificial material 611. As shown in FIG. 5d, the sacrificial material 611 is polished so that the upper surface of the sacrificial material 611 is flush with the upper surface of the insulating layer 211. Preferably, the upper surfaces of the sacrificial material 611 and the insulating layer 211 are polished by CMP (Chemical Mechanical Polishing), so as to ensure that the upper surfaces of the sacrificial material 611 and the insulating layer 211 remain flat. Therefore, the piezoelectric layer 413 can have a relatively flat surface, which reduces the stress influence and improves the resonance performance of the device. The sacrificial material 611 inside the second cavity 512 plays the role of a sacrificial material, and the sacrificial material 611 outside the second cavity 512 plays the role of dielectric filling.

Figure 5E:
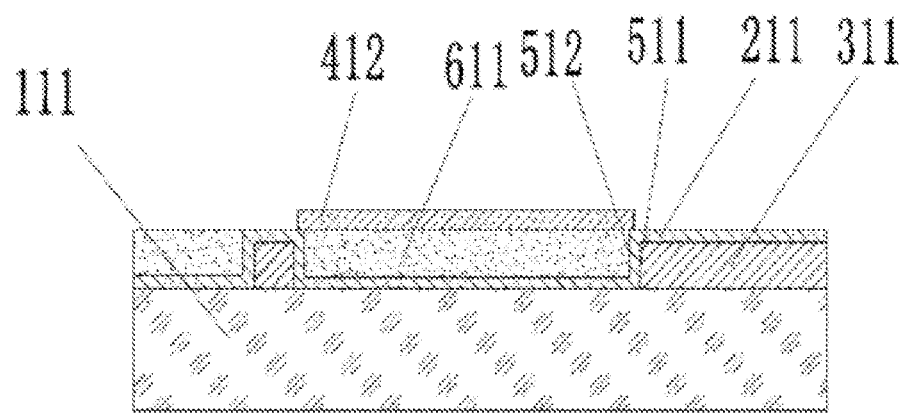
Figure 5F:
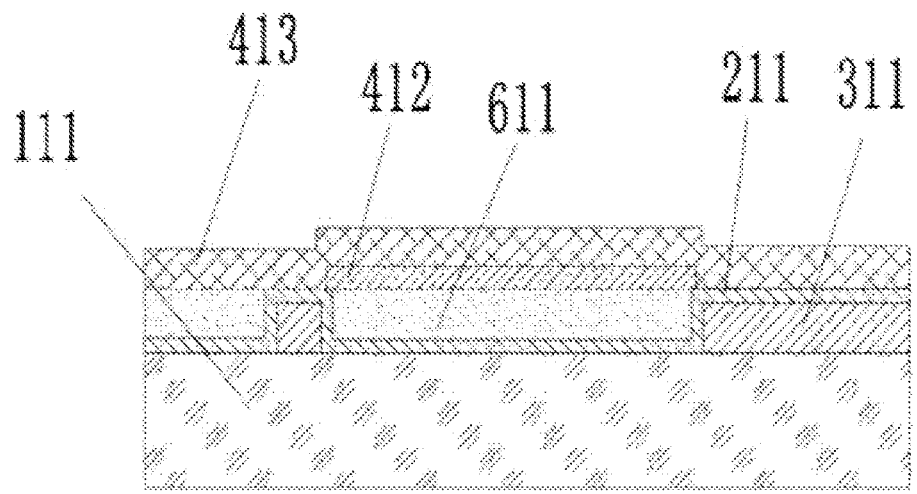
Figure 5G:
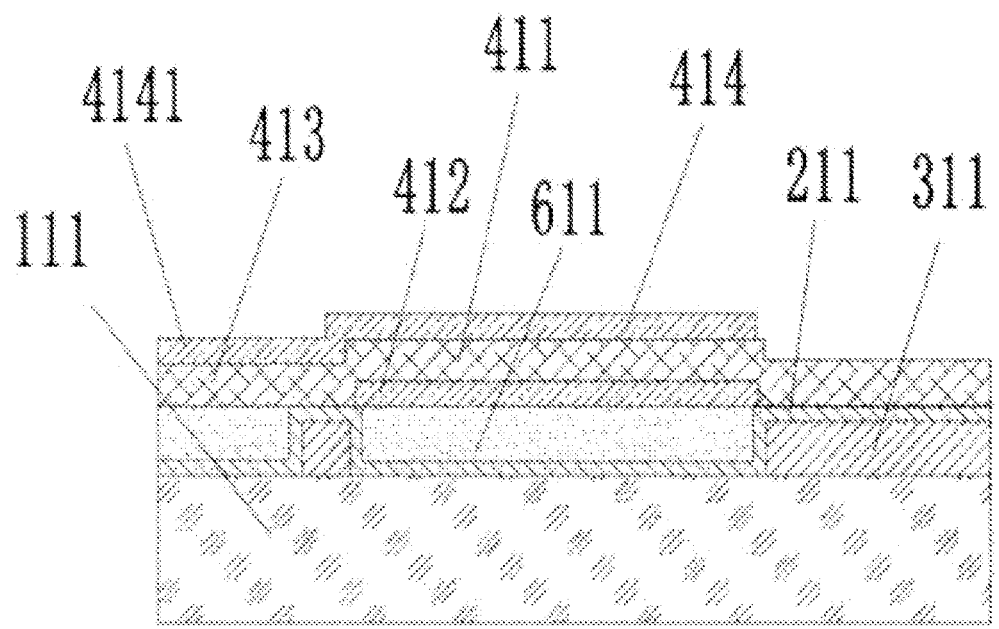

In a specific embodiment, as shown in FIG. 5e, the bottom electrode layer 412 covering the second cavity 512 is fabricated on the sacrificial material 611 and the insulating layer 211 by sputtering, photolithography and etching, and an edge of the bottom electrode layer 412 is laid on the insulating layer 211 formed on a side of the second cavity 512. The metal heat dissipation layer 311 defines the first cavity 511 on the substrate 111. Moreover, the metal heat dissipation layer 311 is covered by the insulating layer 211, so the insulating layer 211 is also formed on the first cavity 511, and the second cavity 512 is formed on the insulating layer 211. The bottom electrode layer 412 is laid on the insulating layer 211 and covers the second cavity 512. The edge of the bottom electrode layer 412 is laid on the insulating layer 211 formed on the side of the first cavity 511, and a projection of the bottom electrode layer 412 on the substrate 111 does not exceed the range of the first cavity 511. Therefore, no capacitor is formed between the bottom electrode layer 412 and the metal heat dissipation layer 311, which can effectively reduce parasitic effects without affecting the performance of the bulk acoustic resonator. As shown in FIG. 5f, the piezoelectric layer 413 is formed on the bottom electrode layer 412 by sputtering, photolithography and etching. As shown in FIG. 5g, the top electrode layer 414 is formed on the piezoelectric layer 413 by sputtering, photolithography and etching. The material of the bottom electrode layer 412 and the top electrode layer 414 includes Mo, and the material of the piezoelectric layer 413 includes AlN.

In a preferred embodiment, the top electrode layer 414 includes the connecting part 4141 extending from the effective resonance area to another peripheral resonator, and the metal heat dissipation layer 311 is not completely distributed below the connecting part 4141. A part of the metal heat dissipation layer 311 which plays a supporting role presents below the part where the connecting part 4141 of the top electrode layer 414 is connected to the effective resonance area. The part of the metal heat dissipation layer 311 supports the bottom electrode layer 412 and forms the second cavity 512 together with the insulating layer 211. As little metal heat dissipation layer 311 as possible should be distributed below the top electrode layer 414, because a capacitor can be easily formed between the top electrode layer 414 and the metal heat dissipation layer 311, and the capacitor will affect the performance of the bulk acoustic resonator.

Figure 6:
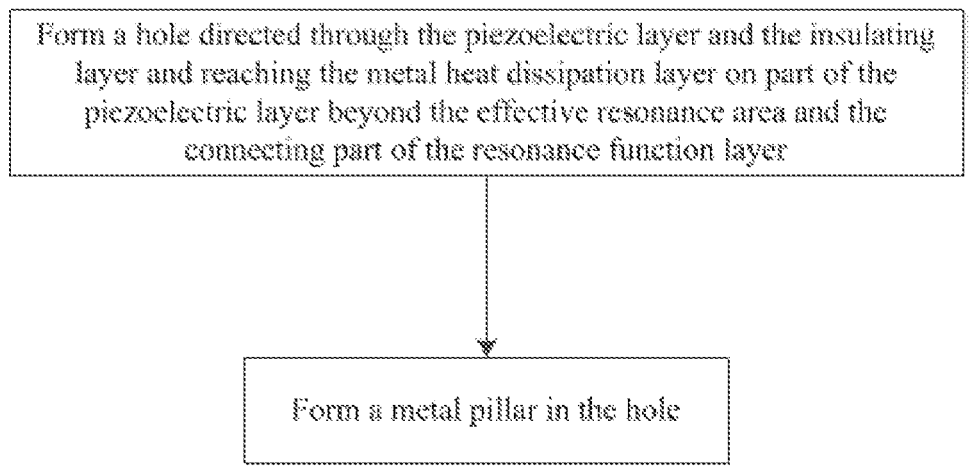
FIG. 6 shows a flowchart of steps S5-S6 of the fabrication process of a bulk acoustic resonator with a heat dissipation structure according to an embodiment of the present application.

In a specific embodiment, as shown in FIG. 6, the fabrication process further includes:

S5: forming a hole directed through the piezoelectric layer and the insulating layer and reaching the metal heat dissipation layer on part of the piezoelectric layer beyond the effective resonance area and the connecting part of the resonance function layer; and S6: forming a metal pillar in the hole.

Figure 5H:
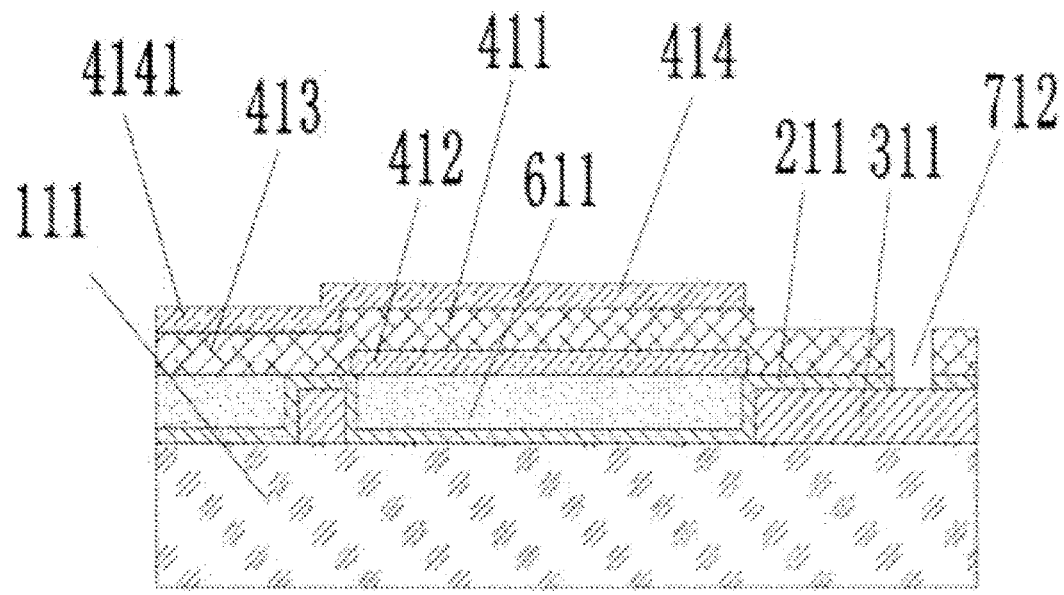
Figure 5I:
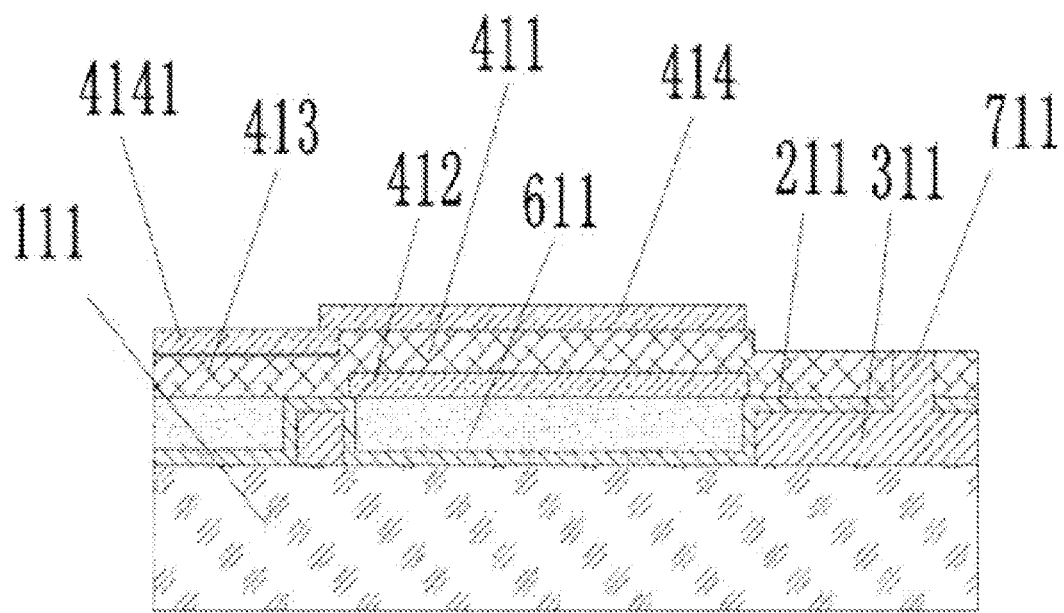

In a preferred embodiment, as shown in FIG. 5h and FIG. 5i, the metal pillar 711 is formed by photolithography, etching, and sputtering (or electroplating). A hole 712 directed through the piezoelectric layer 413 and the insulating layer 211 and reaching the metal heat dissipation layer 311 is first obtained by etching. Then, a metal pillar 711 is formed in the hole 712. The metal pillar 711 is formed on the area beyond the effective resonance area and the connecting part 4141 of the top electrode layer 414, which does not affect the performance of the bulk acoustic resonator, and can dissipate the heat in the metal heat dissipation layer 311.

Figure 5J:
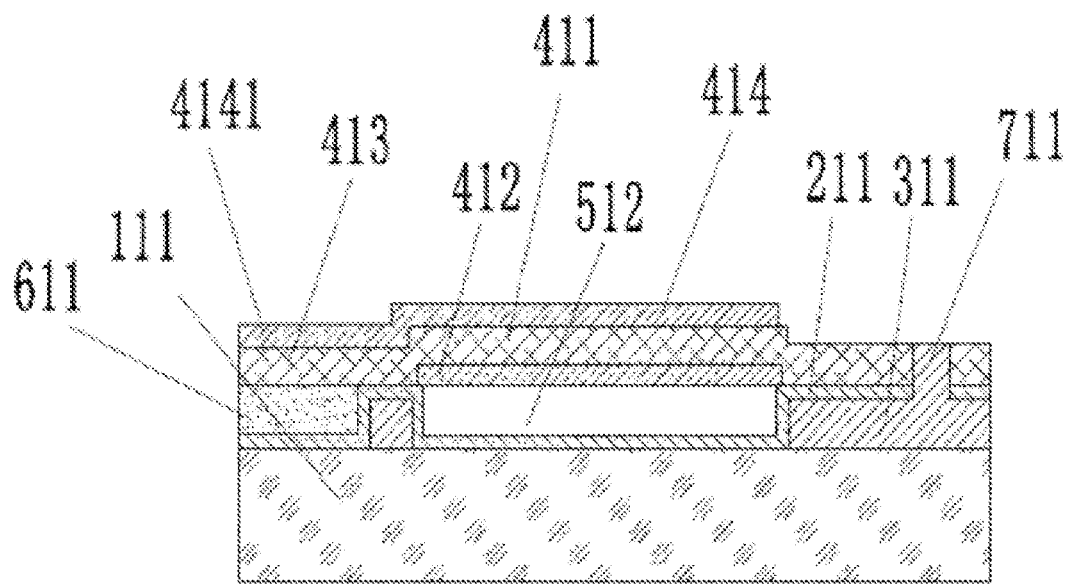

In a specific embodiment, as shown in FIG. 5j, the following step is further included after step S6: removing the sacrificial material 611 in the second cavity 512. After the sacrificial material 611 in the second cavity 512 is removed, a complete structure of the second cavity 512 is formed.

Figure 7A:
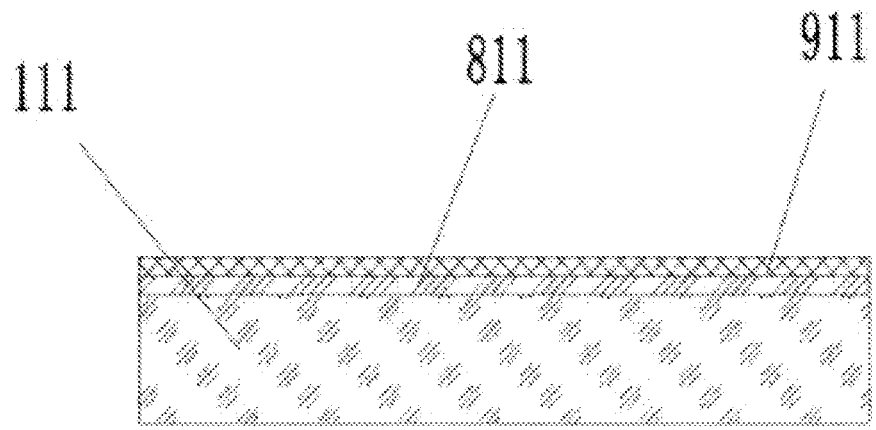
FIGS. 7a-7b show schematic structural diagrams of respective steps of the fabrication process of a bulk acoustic resonator with a heat dissipation structure according to another embodiment of the present application.
Figure 7B:
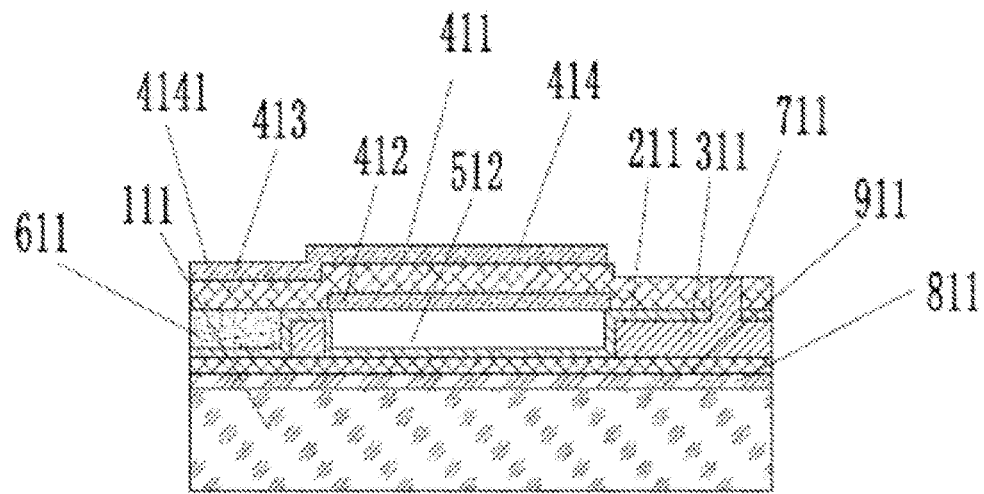

In a specific embodiment, as shown in FIG. 7a, the following step is further included before S1: forming an adhesive layer 811 on the substrate 111. The adhesive layer 811 can increase the adhesion of a metal shielding layer 911, and can also play a role of electromagnetic shielding. The bulk acoustic resonator further includes the metal shielding layer 911 provided on the adhesive layer 811. With other steps being the same, the bulk acoustic resonator as shown in FIG. 7b is finally obtained. Therefore, the metal heat dissipation layer 311 is formed on the metal shielding layer 911, and the metal shielding layer 911 is in conduction with the metal heat dissipation layer 311 and the metal pillar 711. If the metal pillar 711 is grounded, an electromagnetic shielding structure can be formed between the metal shielding layer 911, the metal heat dissipation layer 311 and the metal pillar 711, shielding external electromagnetic interference sources and shielding electromagnetic interference from internal to external, so that the bulk acoustic resonator has an electromagnetic shielding effect. The adhesive layer 811 provided on the substrate 111 can increase the adhesion of the metal shielding layer 911, and can also play a role of electromagnetic shielding. Preferably, the material of the adhesive layer 811 can be selected from Ti or TiW, and the material of the metal shielding layer 911 can be selected from metals such as Cu. Therefore, the finally obtained bulk acoustic resonator not only has good heat dissipation effect, but also has excellent electromagnetic shielding effect.

A bulk acoustic resonator with a heat dissipation structure and a fabrication process are disclosed according to the embodiments of the present application, where the bulk acoustic resonator includes a substrate, a metal heat dissipation layer formed on the substrate and provided with an insulating layer on its surface, and a resonance function layer formed on the insulating layer. The metal heat dissipation layer and the insulating layer define a cavity on the substrate, and a bottom electrode layer in the resonance function layer covers the cavity. The metal heat dissipation layer is arranged around the cavity, so the bulk acoustic resonator can dissipate heat in time during use, thereby improving the service life of the bulk acoustic resonator. In the structural design of the bulk acoustic resonator according to embodiments of the present application, the metal heat dissipation layer, the bottom electrode layer and the top electrode layer are such arranged as not to form capacitors as much as possible, so as to reduce the parasitic capacitance of the resonator and effectively improve the performance of the resonator. In addition, the resonator may further include an electromagnetic shielding structure, so that under the premise of reducing the parasitic capacitance of the resonator, the resonator has good heat dissipation and anti-electromagnetic shielding effect during use, and has good reliability while working normally and stably.

The above described are specific embodiments of the present invention and the protection scope of the present application is not limited to the above embodiments. Any modifications or replacements that can be easily conceived by those skilled in the art within the technical scope of the present application should fall within the protection scope of the present application. Therefore, the scope of protection of the present application should be defined by the appended claims.

In the description of the present application, it should be appreciated that the orientation or positional relationship indicated by the terms such as "upper", "lower", "internal", and "external", are based on the orientation or positional relationship shown in the drawings, which are only used to facilitate the description of the present application and to simplify the description, rather than indicating to indicate or imply that the devices or elements referred to must have a specific orientation or can only be configured and operated in a particular orientation. Therefore the above-mentioned terms should not be construed as a limitation to the present application. The term 'including' does not exclude the presence of elements or steps not listed in the claims. The term 'a' or 'an' preceding an element does not exclude the existence of multiple such elements. The mere fact that certain measures are recited in mutually different dependent claims does not indicate that a combination of these measures cannot be used to advantage. Any reference signs in the claims should not be construed as limiting the scope.

The invention claimed is:

1. A bulk acoustic resonator with a heat dissipation structure, comprising a substrate, a metal heat dissipation layer formed on the substrate and provided with an insulating layer on a surface of the metal heat dissipation layer, and a resonance function layer formed on the insulating layer, wherein the metal heat dissipation layer and the insulating layer define a cavity on the substrate, a side wall of the cavity is formed by the insulating layer, and a bottom electrode layer in the resonance function layer covers the cavity.

2. The bulk acoustic resonator with a heat dissipation structure according to claim 1, wherein an edge of the bottom electrode layer is laid on the insulating layer formed on a side of the cavity.

3. The bulk acoustic resonator with a heat dissipation structure according to claim 1, wherein the resonance function layer further comprises a piezoelectric layer and a top electrode layer which are sequentially stacked on the bottom electrode layer, the top electrode layer comprises a connecting part extending from an effective resonance area of the resonance function layer to a peripheral resonator, and the metal heat dissipation layer is not completely distributed below the connecting part.

4. The bulk acoustic resonator with a heat dissipation structure according to claim 3, wherein a sacrificial material layer is arranged in a gap below the connecting part and the piezoelectric layer, wherein an upper surface of the sacrificial material layer is flush with an upper surface of the insulating layer, and the piezoelectric layer is disposed on upper surfaces of the sacrificial material layer, the insulating layer and the bottom electrode layer.

5. The bulk acoustic resonator with a heat dissipation structure according to claim 3, wherein part of the piezoelectric layer, beyond the effective resonance area and the connecting part, is provided with a metal pillar, wherein the metal pillar extends through the piezoelectric layer and the insulating layer, and extends to the metal heat dissipation layer.

6. The bulk acoustic resonator with a heat dissipation structure according to claim 1, wherein the bulk acoustic resonator further comprises an adhesive layer disposed on the substrate.

7. The bulk acoustic resonator with a heat dissipation structure according to claim 6, wherein a metal shielding layer is provided on the adhesive layer.

8. The bulk acoustic resonator with a heat dissipation structure according to claim 1, wherein the metal heat dissipation layer is made of a composite multilayer metal layer material composed of one or more of Ag, Cu, Au, Al, Mo, W, Zn, Ni, Fe and Sn.

9. The bulk acoustic resonator with a heat dissipation structure according to claim 1, wherein the material of the insulating layer comprises one or more of AN, Si and SiN.

10. The bulk acoustic resonator with a heat dissipation structure according to claim 5, wherein the material of the metal pillar comprises Ag, Cu, Au, Al, Mo, W, Zn, Ni, Fe, or Sn.

* * * * *